United States Patent [19]

Herz et al.

[11] Patent Number: 5,357,278
[45] Date of Patent: Oct. 18, 1994

[54] INTEGRATED LINEAR/NON-LINEAR STATIC AND CONTROLLABLE DYNAMIC COMPANDING

[75] Inventors: William Herz, Newark; David Rossmere, San Jose, both of Calif.

[73] Assignee: Sony Electronics, Inc., Park Ridge, N.J.

[21] Appl. No.: 4,507

[22] Filed: Jan. 14, 1993

[51] Int. Cl.$^5$ .............................................. H04N 7/12
[52] U.S. Cl. ..................................... 348/384; 348/390
[58] Field of Search ............... 358/160, 166, 133, 181; 341/138; 375/122, 30; 384/390, 384, 404, 405; H04N 5/208, 7/12, 7/13, 5/14

[56] References Cited

U.S. PATENT DOCUMENTS

| | | | |
|---|---|---|---|
| 3,562,420 | 2/1971 | Thompson | 358/133 |
| 3,969,680 | 7/1976 | Wermuth | 330/29 |
| 4,208,740 | 6/1980 | Yin | 375/30 |
| 4,511,922 | 4/1985 | Lewis | 358/166 |
| 4,654,695 | 3/1987 | Fling | 358/133 |
| 4,713,828 | 12/1987 | Meghrgardt | 341/143 |
| 4,776,025 | 10/1988 | Hosoda | 358/166 |
| 4,949,176 | 8/1990 | Levy | 358/135 |
| 4,965,668 | 10/1990 | Abt | 358/160 |
| 5,005,082 | 4/1991 | Zdepski | 358/135 |
| 5,041,830 | 8/1991 | Abe | 341/77 |

FOREIGN PATENT DOCUMENTS

| | | | |
|---|---|---|---|
| 73309 | 3/1983 | European Pat. Off. | H04N 7/13 |
| 484946 | 5/1992 | European Pat. Off. | H04L 25/49 |
| 65719 | 3/1988 | Japan | H03M 1/10 |
| 228334 | 9/1989 | Japan | 341/94 |

*Primary Examiner*—Mark R. Powell
*Assistant Examiner*—Chris Grant
*Attorney, Agent, or Firm*—Irell & Manella

[57] ABSTRACT

A memory module, a partial address generator, and a controllable pseudo-random number generator are provided to a digital video system for generating values used to perform static/dynamic companding for transfer functions shifting/modifying digital video data. The memory module is used for storing an integrated collection of lookup tables comprising lookup tables having values used to perform linear/non-linear static and dynamic companding. The values used to perform static/dynamic companding are retrieved using composite addresses. During each access, the higher order bits are generated by the partial address generator, and the lower order bits are set to equal the current digital video data value being shifted/modified. The partial address generator generates the higher order bits of the composite address based on a number of companding scheme selection control signals and a pseudo-random number received as inputs. The controllable pseudo-random number generator generates the pseudo-random numbers based on the current value of a digital video control counter. Additionally, in the presently preferred embodiment, a quantization error detector is also provided to generate the dynamic companding scheme selection control signals when quantization errors are detected, thereby controlling and causing dynamic companding to be performed only when it is necessary.

25 Claims, 5 Drawing Sheets

| DYNAMIC ROUNDING ENABLE | PARTIAL ADDRESS GENERATOR OUTPUT 28 | | | | |
|---|---|---|---|---|---|
| | OUT<0> | OUT<1> | OUT<2> | OUT<3> | OUT<4> |
| YES | RN<0> | RN<1> | RN<2> | RN<3> | RN<4> |
| NO | B<0> | B<1> | ∅ | ∅ | ∅ |

NOTE: PARTIAL ADDRESS GENERATOR OUTPUT OUT <4:0>=CONTROL ADDRESS A<2:8>

*Figure 4*

INTEGRATED LINEAR/NON-LINEAR STATIC AND CONTROLLABLE DYNAMIC COMPANDING

BACKGROUND OF THE INVENTION

1. Field of the Invention

The present invention relates to the field of digital video systems. More specifically, the present invention relates to static and dynamic companding performed on these digital video systems.

2. Background

In digital video systems, it is common to find digital video data being shifted/modified from one range to another, for example, from 0-255 to 16-235, or from 0-255 to 1-254. The digital video data may be shifted/modified for a variety of reasons including but not limited to filtering. In the process of shifting/modifying digital data, rounding errors will occur. In the example of shifting/modifying data from 0-255 to 16-235, the 8-bit output data would be computed from the transfer function Data_out=Truncated (Data_in×(219/255)+16). Data_out would be 16 for both Data_in=0, and Data_in=1; Data_out would be 22 for both Data_in=7 and Data_in=8; etc. Very often dynamic companding or rounding will be employed to minimize the impact of rounding errors, a phenomenon which can manifest itself as visual banding. Dynamic companding is a process that varies quantization ranges in order to mask the rounding errors, or visual banding, by rounding up or rounding down based on probability, rather than simply truncating.

However, there is a tradeoff in using dynamic companding to ameliorate the rounding error situation. Random noise is introduced into the video image as a result of rounding up or down based on probability. The additional random noise can reduce the clarity of the image, as an entire frame will have additional noise. Additionally, traditional dynamic companding or rounding approaches are typically uncontrollable. That is, identical dynamic companding, though random within a defined intra-frame area, can not be identically replicated on another similar area. Therefore, the additional random noise also reduces the quality of the image as a result of their inter-frame independence. Thus, it is desirable if the digital video system would dynamically round the digital video data only when necessary (as rounding errors occur horizontally or vertically adjacent to each other). Furthermore, it is desirable if the dynamic companding is controllable within a horizontal line, an intra-frame area or a frame. Then, the rounding error situation can be ameliorated with minimal compromises to the video quality of the video image.

While dynamic companding is often used to minimize the rounding errors, or visual banding, depending on the application, there are times linear or non-linear static companding may be more suitable to ameliorate the rounding error situation. Static companding is a process that varies quantization ranges in order to mask the rounding errors, or visual banding, by rounding up or rounding down based on a predetermined manner. Thus, it is desirable if the digital video system can support multiple linear/non-linear static companding schemes and dynamic companding schemes in an integrated manner.

As will be disclosed, the present invention provides a method and apparatus for selectively performing controllable dynamic companding, and linear/non-linear static companding in a digital video system that achieves the above described desirable results.

SUMMARY OF THE INVENTION

A method and apparatus for selectively performing controllable dynamic companding, and linear/non-linear static companding in a digital video system in an integrated manner is disclosed. Under the disclosed method and apparatus, both dynamic and static companding are advantageously supported. Furthermore, dynamic companding is controllable, and static companding includes linear as well as non-linear static companding. The advantageous results are achieved by providing a memory module, a partial address generator, and a controllable pseudo-random number generator to a digital video system for generating companding values of digital video data being shifted/modified, regardless of whether the digital video data are being shifted/modified by linear or non-linear static companding or dynamic companding.

The memory module is used for storing an integrated collection of lookup tables comprising a plurality of lookup tables having values used to perform linear/non-linear static companding, and at least one set of lookup tables having values used to perform dynamic companding. For each set of lookup tables having values used to perform dynamic companding, the values used to perform dynamic companding for a particular digital video data value, reflecting the weighted probabilities of rounding in the up or down direction, are randomly dispersed among the lookup tables in the set. The values used to perform static/dynamic companding are retrieved using composite addresses. The higher order bits of a composite address identify a particular lookup table in the collection, and the lower order bits of the composite address identify a particular value within the identified lookup table. During each access, the higher order bits are generated by the partial address generator, and the lower order bits are set to equal the current digital video data value being shifted/modified.

The partial address generator generates the higher order bits of a composite address based on a number of static and dynamic companding scheme selection control signals and a pseudo-random number it received as inputs. If the companding scheme selection control signals select a particular lookup table having values used to perform static companding, the static companding scheme selection control signals are outputed as the higher order bits of the composite address. On the other hand, if the companding scheme selection control signals select a particular set of lookup tables having values used to perform dynamic companding, the pseudo-random number is outputed as the higher order bits of the composite address.

The controllable pseudo-random number generator generates the pseudo-random numbers for the partial address generator based on the current value of a digital video control counter it received as input. The pseudo-random number sequence is replicated whenever the video control counter is reinitialized to a predetermined value, e.g. zero, and the shift register set in the pseudo-random number generator is reset to a predefined state, e.g. a zero state. Thus, the same dynamic companding may be replicated for different instances of the video image area controlled by the video control counter.

In one embodiment, the controllable pseudo-random number generator generates the pseudo-random numbers based on the horizontal pixel counter. The pseudorandom number sequence is replicated whenever the horizontal pixel counter is reinitialized to zero for a new horizontal line, and the shift register set in the pseudorandom number generator is reset to a zero state. As a result, the same dynamic companding is replicated for each horizontal line of the video image.

Additionally, in the presently preferred embodiment, a quantization error detector is also provided to the digital video system to provide the dynamic companding scheme selection control signals to the partial address generator. The quantization error detector provides the dynamic companding scheme selection control signals when quantization errors are detected, thereby controlling and causing dynamic companding to be performed for a particular data shift/modification only when it is necessary. The static companding scheme selection control signals are provided by the processor of the digital video system.

BRIEF DESCRIPTION OF THE DRAWINGS

The objects, features, and advantages of the present invention will be apparent from the following detailed description of the presently preferred and alternate embodiments of the invention with references to the drawings in which.

DETAILED DESCRIPTION PRESENTLY PREFERRED AND ALTERNATE EMBODIMENTS

A method and apparatus for selectively performing controllable dynamic companding, and linear/non-linear static companding in a digital video system in an integrated manner is disclosed. Under the disclosed method and apparatus, both dynamic and static companding are advantageously supported. Furthermore, dynamic companding is controllable, and static companding includes linear as well as non-linear static companding. In the following description for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatical or block diagram form in order not to obscure the present invention unnecessarily.

Figure 1A:
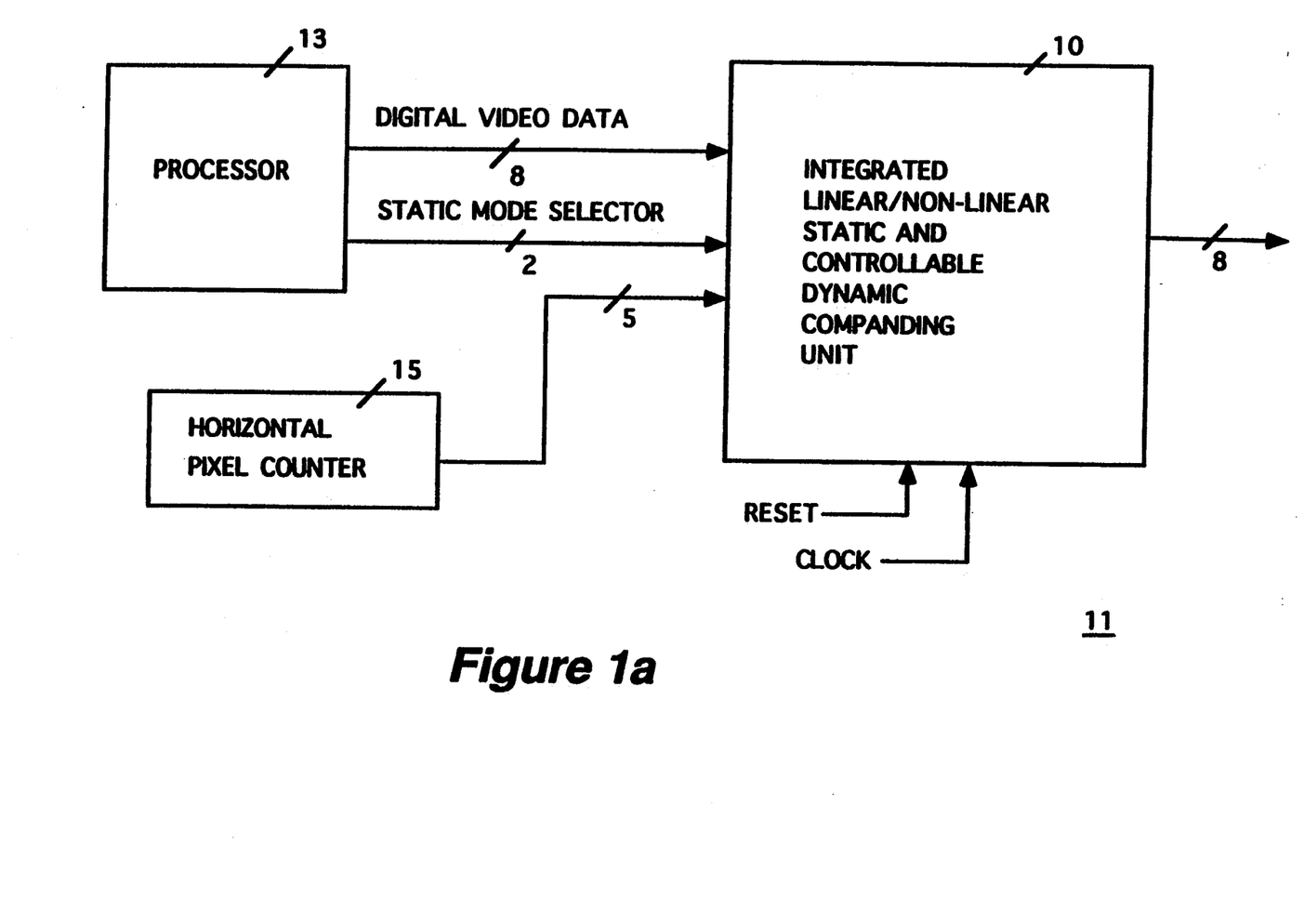
FIGS. 1a-1b illustrate one embodiment of the present invention for integrated linear/non-linear static and controllable dynamic companding.
Figure 1B:
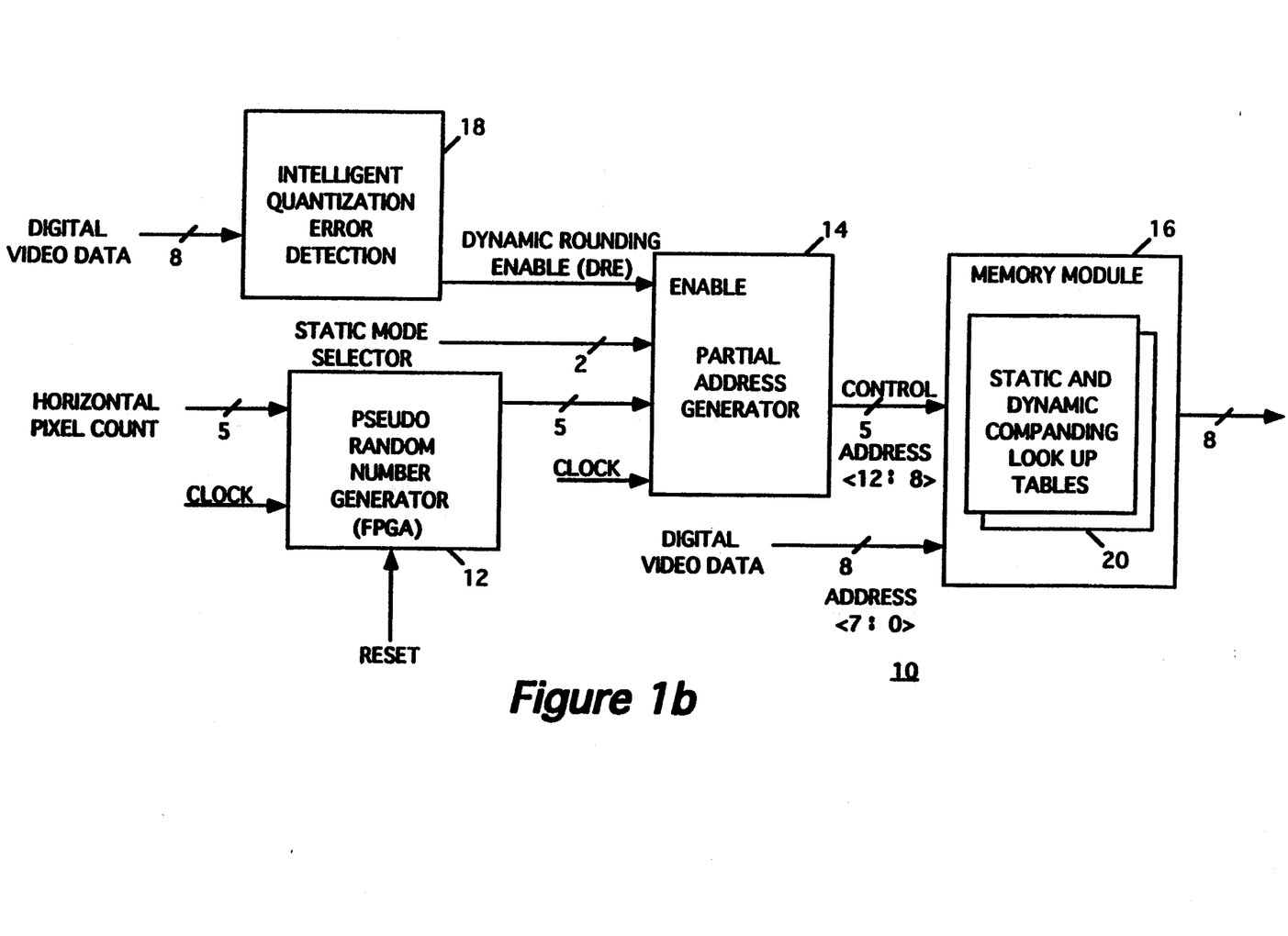

Referring now to FIGS. 1a-1b, two block diagrams illustrating one embodiment of the present invention for integrated linear/non-linear static and controllable dynamic companding are shown. As illustrated in FIG. 1a, in this embodiment, the integrated linear/non-linear static and controllable dynamic companding unit 10 of the present invention is coupled to the processor 13 and the horizontal pixel counter 15 of the digital video system 11. As illustrated in FIG. 1b, under this embodiment, the integrated linear/non-linear static and controllable dynamic companding unit 10 comprises a memory module 16, a partial address generator 14, an intelligent quantization error detection unit 18, and a pseudo random number generator 12. The memory module 16 is coupled to the partial address generator 14. The partial address generator 14 is in turn coupled to the quantization error detector 18, and the controllable pseudo random number generator 12. Together, they cooperate to provide values used to perform static/dynamic companding for digital video data being shifted/modified. Each of these elements 12-18 and the manner they cooperate with each other will be described in order with periodic additional references to the remaining figures.

Figure 2:
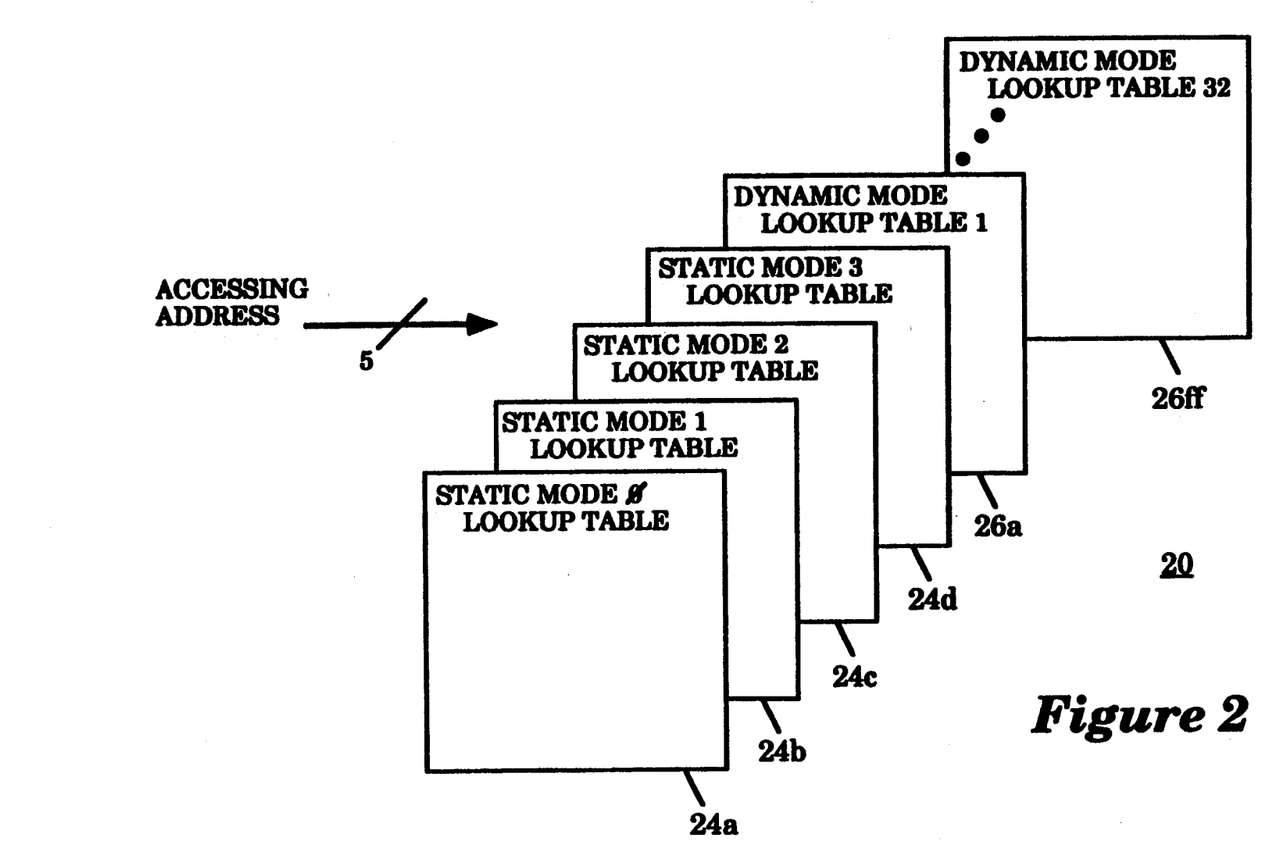
FIG. 2 illustrates the integrated collection of lookup tables of the present invention for the embodiment illustrated in FIG. 1b, and accessing these lookup tables.
Figure 3:
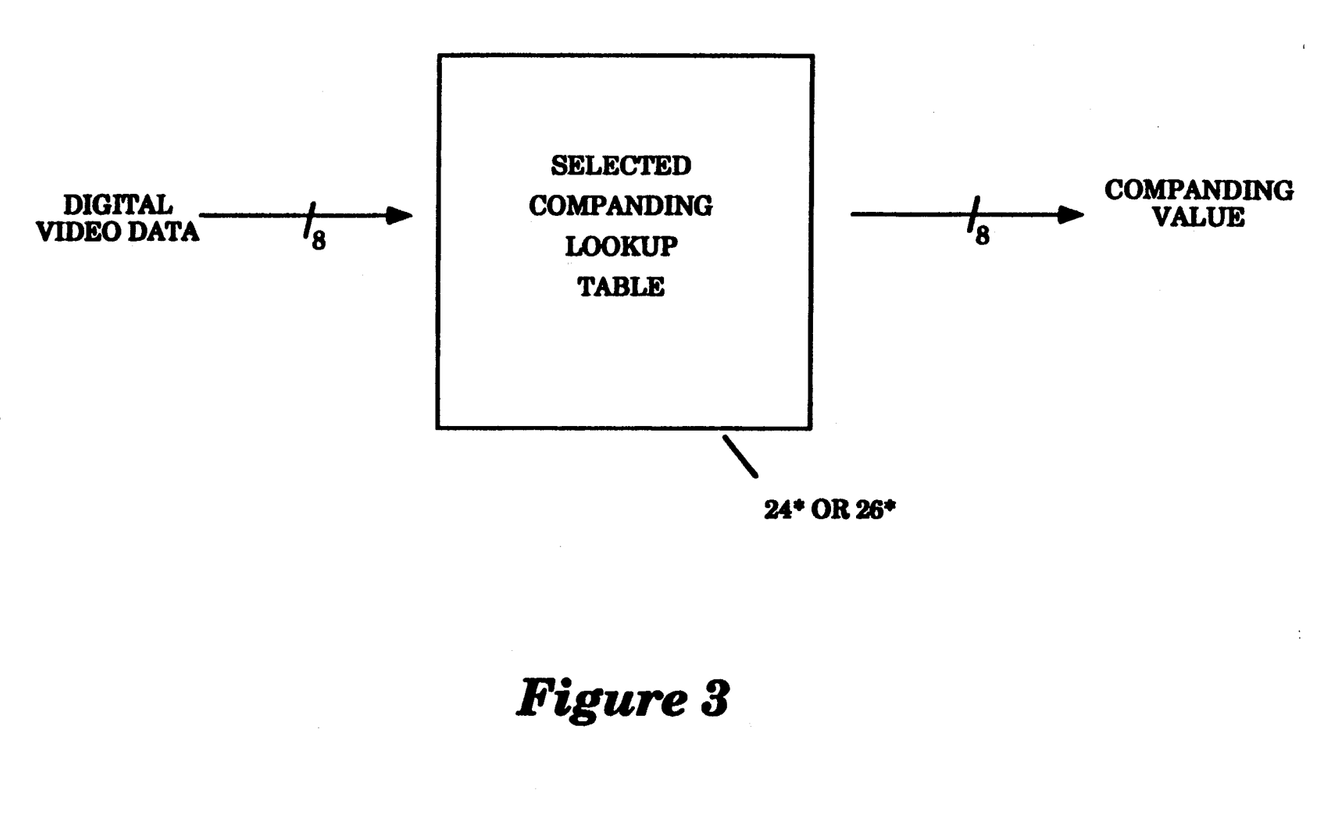
FIG. 3 illustrates an accessed lookup table and accessing its values used to perform static/dynamic companding.

The memory module 16 will first be described with additional references to FIGS. 2-3. The memory module 16 is used for storing an integrated collection of lookup tables 20 comprising a plurality of lookup tables 24a-24d having values used to perform linear/non-linear static companding, and at least one set of lookup tables 26a-26ff having values used to perform dynamic companding. In this embodiment, the collection of lookup tables 20 comprises four lookup tables 24a-24d having values used to perform linear/non-linear static companding, and a set of thirty-two lookup tables 26a-26ff having values used to perform dynamic companding. Each of the four lookup tables 24a-24d having values used to perform linear/non-linear static companding provides eight-bit values to perform static companding for a particular data shifting/modifying function of eight-bit digital video data. In each of the four cases, rounding is performed in a deterministic manner. The set of thirty-two lookup tables 26a-26ff having values used to perform dynamic companding collectively provides eight-bit values to perform dynamic companding for a particular data shifting/modifying function of eight-bit digital video data. In this case, rounding is performed in a stochastic manner.

For example, the first lookup table 24a having values used to perform static companding may provide values to perform linear static companding for digital video data being shifted/modified from 0-255 to 1-254 with rounding performed in a deterministic manner; the second lookup table 24b may provide a gamma type curve with distributed values to perform non-linear static companding for digital video data being shifted/modified from 0-255 to 16-235 with rounding also performed in a deterministic manner; etc. etc.; and the set of thirty-two dynamic companding look-up tables 26a-26ff having values used to perform dynamic companding may provide values to perform dynamic companding for digital video data being shifted/modified from 0-255 to 16-235 with rounding performed in a stochastic manner.

While the present invention is being described with an embodiment comprising four lookup tables having values used to perform static companding and one set of thirty-two lookup tables having values used to perform dynamic companding, based on the description to follow, it will be appreciated that the present invention may be practiced with additional lookup tables having values used to perform static companding as well as larger set and/or additional sets of lookup tables having values used to perform dynamic companding, provided other aspects of the present invention such as the size of the accessing composite address, and the number of companding scheme selection control signals are adjusted accordingly.

Still referring to FIGS. 1a–1b, and 2–3 in this embodiment, the values used to perform static/dynamic companding are accessed using composite addresses of thirteen bits. The five higher order bits of a composite address identify a particular lookup table, 24a, . . . or 26ff, and the eight low order bits identify a value used to perform static/dynamic companding within the identified lookup table, 24* or 26*. The higher order bits are generated by the partial address generator 14, and the lower order bits are set to equal the digital video data by the processor 13 of the digital video system. The higher order bits are generated in such a manner that each of the lookup table within the set of lookup tables having values used to perform dynamic companding has an equal probability of being accessed when values used to perform dynamic companding are accessed. The partial address generator 14 and generation of the higher order bits will be described in further detail later.

The values stored in the set of lookup tables 26a–26ff to perform dynamic companding for a particular digital video data value reflect the weighted probabilities of rounding the shifted/modified digital video data value in either the up or down direction. These weighted probabilities are determined by the fractional value of the digital video data value being shifted/modified. For example, for the shifted/modified value of an exemplary input value of 10 in the above described example of shifting/modifying digital video data from 0–255 to 16–235, the weighted probability of rounding up is 59% (Fraction(10×219/255)), and the weighted probability of rounding down is 41% (1-Fraction(10×219/255)). The number of values rounding a shifted/modified digital video data value up or down are in turn determined by dividing the weighted probabilities with the lookup table access probability (3.125% or 1/32 for the set of 32 lookup tables in this embodiment). In other words, in the set of 32 lookup tables in this embodiment, for the exemplary digital video data value of 10 in the above described example, there are 19 values rounding the shifted/modified value up (19/32≅59%), and 13 companding values rounding the shifted/modified value down (13/32≅41%). The values are randomly dispersed among the lookup tables in the set, so as to be more true to the determined probability.

One particular approach for achieving these characteristics is to store the values used to perform dynamic companding in the lookup tables, 26a–26ff, by comparing a value X to a value Y, where X is the fractional value of n/N, and Y is the fractional value of the shifted/modified digital video data, n being a randomly selected integer between 1 and N, where the random selection is made without replacing the selected integers, and N being the number of lookup tables in the set. Thus, for the set of 32 lookup tables in this embodiment, N equals 32, and n is a randomly selected integer between 1 and 32. If X is greater than Y, a shifted/modified digital video data value having been rounded down is substituted. On the other hand, if X is less than or equal to Y, a shifted/modified digital video data value having been rounded up is substituted. For example, assume that the integer n for one of the 32 lookup tables is 3, the value X is 0.09375 (3/32). Therefore, the value stored in the lookup table for the exemplary value of 10 of the above described example is the shifted/modified value having been rounded up, i.e. the value of 25, since X is smaller than Y, Y being equal to 0.59 (Fraction(10×219/255)). On the other hand, if the integer n for the lookup table is 30, the value X is 0.9375 (30/32). Therefore, the value stored in the lookup table for the exemplary value 10 of the above described example is the shifted/modified value having been rounded down, i.e. the value 24, since X is greater than Y.

Figure 4:
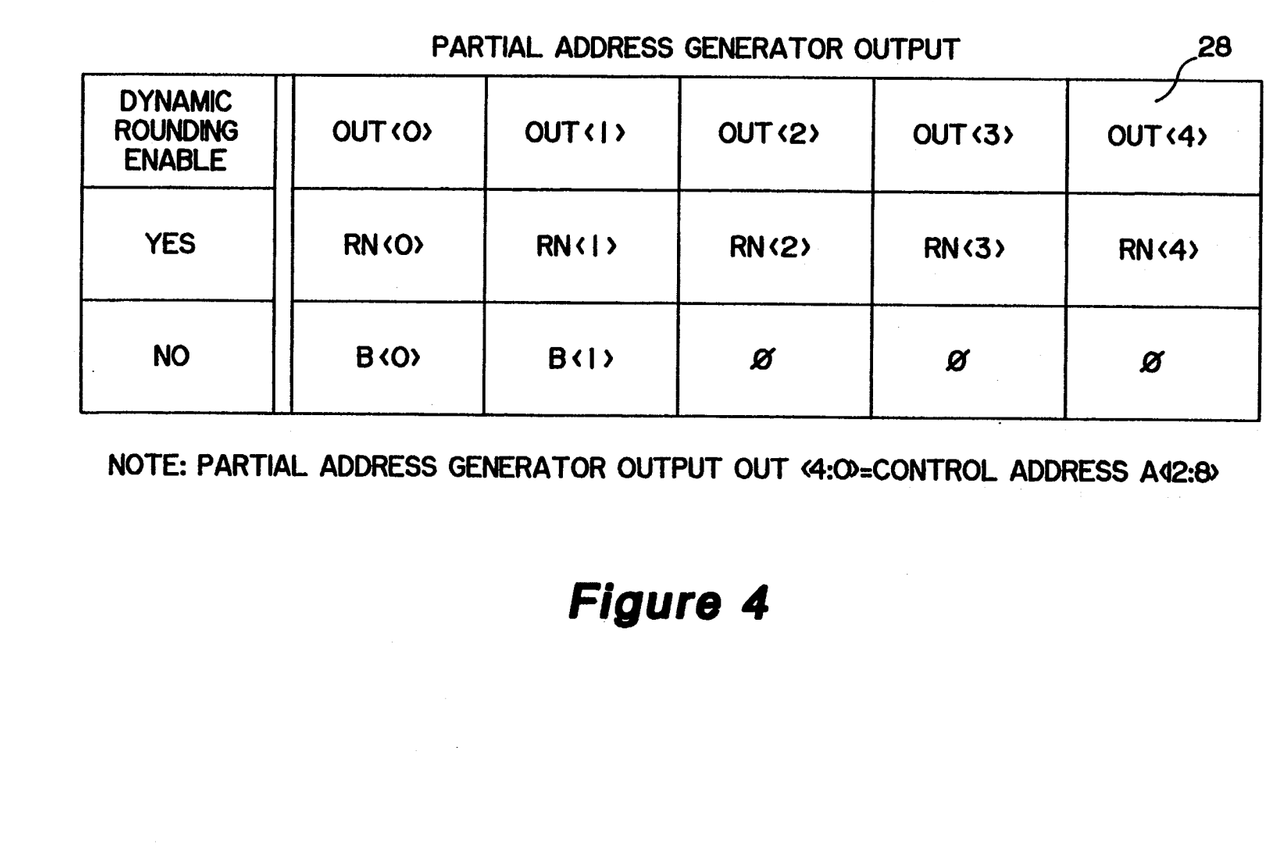
FIG. 4 illustrates how the partial address generator of FIG. 1b generates the higher order bits of the composite access address.

Referring now to FIGS. 1a–1b and 4, the partial address generator 14 will now be described. As described earlier, the partial address generator 14 generates the higher order bits of the composite addresses for accessing the values of the lookup tables stored in the memory module 16. For the embodiment illustrated in FIG. 1, the partial address generator 14 generates the five higher order bits based on a number of companding scheme selection control signals and a pseudo-random number it received as inputs. The partial address generator 14 receives a one-bit dynamic companding scheme selection control signal (dynamic rounding enable (DRE)) from the quantization error detector 18, a two-bit static companding scheme selection control signal (B<0> and B<1>) from the processor 13 of the digital video system, and a five bit pseudo-random number (PRN<0>–PRN<4>) from the pseudo-random number generator 12. As illustrated in FIG. 4, if DRE is set to enable, the partial address generator 14 outputs the pseudo-random number as the higher order bits, i.e. A<8>–A<12> equal PRN<0>–PRN<4> respectively, otherwise, it outputs the padded static companding scheme selection control signal as the higher order bits, i.e. A<8>–A<12> equal B<0>, B<1>, 0,0,0 respectively. In the presently preferred embodiment, the partial address generator 14 is implemented with a field programmable gate array (FPGA) which is well known in the art and will not be described further. Alternatively, the partial address generator 14 may be implemented with other circuitry providing equivalent functions.

Referring now to FIGS. 1a–1b the quantization error detector 18 will be described. In this embodiment, the quantization error detector 18 generates the DRE signal for the partial address generator 14. The quantization error detector 18 generates the DRE signal whenever it detects a potential companding error based on the eight-bit digital video data it received as inputs, thereby controlling and causing dynamic companding to be performed only when it is necessary. The quantization error detector 18 is intended to represent a broad category of quantization error detectors. Additionally, while the present invention is being described with the dynamic companding scheme selection signal provided by a quantization error detector, it will be appreciated that the present invention may be practiced with the dynamic companding scheme selection signals provided in other manners.

Still referring to FIGS. 1a–1b the controllable pseudo-random number generator 12 will be described. The controllable pseudo-random number 12 generates the pseudo-random number based on the current value of a video control counter 15 thereby allowing the pseudo-random numbers and in turn the dynamic companding performed to be replicated within a particular area of the video image controlled by the video control counter. Particular examples of video control counter include a horizontal pixel counter, a line counter, a frame counter and a field counter. In this embodiment, the video control counter used is a five-bit horizontal pixel counter 15. The five-bit pseudo-random numbers are generated based on the current value of the five-bit horizontal pixel counter, thereby allowing the pseudo-random numbers and in turn the dynamic companding performed to be replicated within a horizontal line of the video image. The controllable pseudo-random number generator 12 is intended to represent a broad category of controllable pseudo-random number generators.

While the present invention has been described in terms of presently preferred and alternate embodiments, those skilled in the art will recognize that the invention is not limited to the embodiments described. The method and apparatus of the present invention can be practiced with modification and alteration within the spirit and scope of the appended claims. The description is thus to be regarded as illustrative instead of limiting on the present invention.

What is claimed is:

1. In a digital video system comprising a plurality of digital video data, an apparatus for selectively generating values used to perform static and dynamic companding for a plurality of transfer functions for shifting/modifying said digital video data from a first plurality of data ranges to a second plurality of corresponding data ranges, said apparatus comprising:

a) memory means for storing an integrated collection of lookup tables comprising a plurality of lookup tables having values used to perform static and dynamic companding for said transfer functions for shifting/modifying said digital video from said first plurality of data ranges to said second plurality of corresponding data ranges, said values used to perform static and dynamic companding being accessed using composite addresses, each of said composite addresses comprising a plurality of bits;

b) partial address generation means coupled to said memory means for receiving a plurality of static/dynamic companding scheme selection control signals and controllable pseudo-random numbers as inputs, and generating a plurality of higher order bits for each of said composite addresses, the remaining lower order bits for each of said composite addresses being set correspondingly to equal said digital video data being shifted/modified by a processor of said digital video system coupled to said memory means;

c) companding scheme selection control signal generation means coupled to said partial address generation means for generating said companding scheme selection control signals; and d) pseudo-random number generation means coupled to said partial address generation means for receiving values of a video control counter, and generating said controllable pseudo-random numbers, said generated controllable pseudo-random numbers being replicable within a specified area of a video image controlled by said video control counter.

2. The apparatus as set forth in claim 1, wherein, said integrated collection of lookup tables comprise four lookup tables having values used to perform linear/non-linear static companding for a first through fourth transfer function for shifting/modifying said digital video data from an input data range to a first through fourth corresponding data range, and a set of thirty-two lookup tables having values used to perform dynamic companding for a fifth transfer function for shifting/modifying said digital video data from said input data range to a fifth data range;

each of said digital video data and said values used to perform static and dynamic companding are eight bits in size;

each of said composite addresses are thirteen bits in size with the five higher order bits being generated by said partial address generation means, and the eight low order bits being set to equal a digital video data being shifted/modified by said processor of said digital video system.

3. The apparatus as set forth in claim 1, wherein, each of said composite addresses are thirteen bits in size with the five higher order bits being generated by said partial address generation means, and the eight low order bits being set to equal a digital video data being shifted/modified by said processor of said digital video system;

each of said static and dynamic companding scheme selection control signals being two bits and one bit in size respectively; and each of said controllable pseudo-random numbers being five bits in size.

4. The apparatus as set forth in claim 1, wherein, said partial address generation means comprises a field programmable gate array coupled to said companding selection control signal generation means, said pseudo-random number generation means and said memory means, for receiving one bit dynamic companding scheme selection control signals and two-bit static companding selection control signals from said companding scheme selection control signal generation means, and five-bit pseudo random numbers from said pseudo-random number generation means as inputs, and generating the five higher order bits of each of said composite addresses for said memory means.

5. The apparatus as set forth in claim 1, wherein, said companding scheme selection control signal generation means comprises quantization error detection means coupled to said partial address generation means for receiving said digital video data, and conditionally generating the dynamic companding scheme selection control signals of said plurality of static/dynamic companding scheme selection control signals for said partial address generation means, said quantization error detection means generating one of said dynamic companding selection control signals whenever it detects a potential quantization error based on said received digital video data.

6. The apparatus as set forth in claim 5, wherein, said quantization error detection means generates one of said dynamic companding scheme selection control signals whenever it detects a value adjacency condition in at least one of a horizontal and a vertical dimension of pixel adjacency based on said received digital video data.

7. The apparatus as set forth in claim 5, wherein, each of said dynamic companding scheme selection control signals is a one-bit enable signal.

8. The apparatus as set forth in claim 5, wherein, said companding scheme selection control signal generation means comprises processor means of said digital video system coupled to said partial address generation means for generating the static companding scheme selection control signals of said plurality of static/dynamic companding scheme selection control signals for said partial address generation means.

9. The apparatus as set forth in claim 1, wherein each of said static companding scheme selection control signals is a two-bit signal.

10. The apparatus as set forth in claim 1, wherein, said video control counter providing values to said pseudo-random number generation means is a five-bit horizontal pixel counter providing horizontal pixel counts of a horizontal line of a video image to said pseudo-random number generation means.

11. In a digital video system comprising a plurality of digital video data, a method for selectively generating values used to perform static and dynamic companding values for a plurality of transfer functions for shifting/modifying said digital video data from a first plurality of data ranges to a second plurality of corresponding data ranges, said method comprising the steps of:
   a) storing an integrated collection of lookup tables comprising a plurality of lookup tables having values used to perform static and dynamic companding for said transfer functions for shifting/modifying said digital video from said first plurality of data ranges to said second plurality of corresponding data ranges, said values used to perform static and dynamic companding being accessed using composite addresses, each of said composite addresses comprising a plurality of bits;
   b) selectively generating static and dynamic companding scheme selection control signals;
   c) generating controllable pseudo-random numbers based on values of a video control counter, said generated controllable pseudo-random numbers being replicable within a specified area of a video image controlled by said video control counter;
   d) generating higher order bits for each of said composite addresses based on said companding scheme selection control signals and said generated controllable pseudo-random numbers;
   e) setting lower order bits of each of said composite addresses correspondingly to equal said digital video data being shifted/modified; and
   f) accessing said values used to perform static and dynamic companding for said transfer functions for shifting/modifying said digital video data using said composite addresses.

12. The method as set forth in claim 11, wherein,
   said integrated collection of lookup tables comprise four lookup tables having values used to perform linear/non-linear static companding for a first through fourth transfer function for shifting/modifying said digital video data from an input data range to a first through fourth corresponding data range, and a set of thirty-two lookup tables having values used to perform dynamic companding for a fifth transfer function for shifting/modifying said digital video data from said input data range to a fifth data range;
   each of said digital video data and said values used to perform static and dynamic companding are eight bits in size;
   each of said composite addresses are thirteen bits in size with the five higher order bits being generated based on said static/dynamic companding selection control signals and pseudo-random numbers, and the eight low order bits being set to equal digital video data being shifted/modified.

13. The method as set forth in claim 11, wherein,
   each of said composite addresses are thirteen bits in size with the five higher order bits being generated based on said static/dynamic companding selection control signals and pseudo-random numbers, and the eight low order bits being set to equal a digital video data being shifted/modified;
   each of said static and dynamic companding scheme selection control signals being two bits and one bit in size respectively; and
   each of said controllable pseudo-random number being five bits in size.

14. The method as set forth in claim 11, wherein, said step d) comprises the steps of receiving one bit dynamic companding scheme selection control signals, two-bit static companding scheme selection control signals, and five-bit pseudo random numbers as inputs, and generating the five higher order bits of each of said composite addresses.

15. The method as set forth in claim 11, wherein, said step b) comprises the steps of receiving said digital video data, and conditionally generating the dynamic companding scheme selection control signals of said plurality of static/dynamic companding scheme selection control signals, each of said dynamic companding scheme selection control signals being generated whenever a potential quantization error is detected based on said received digital video data.

16. The method as set forth in claim 15, wherein, each of said dynamic companding scheme selection control signals is generated when a value adjacency condition is detected in at least a horizontal and a vertical dimension of pixel adjacency based on said received digital video data.

17. The method as set forth in claim 15, wherein, each of said dynamic companding scheme selection control signals generated in said step b) is a one-bit enable signal.

18. The method as set forth in claim 11, wherein each of said static companding scheme selection control signals generated in said step b) is a two-bit signal.

19. The method as set forth in claim 11, wherein, said video control counter upon which said pseudo-random numbers are generated in said step c) is a five-bit horizontal pixel counter upon whose horizontal pixel counts of a horizontal line of a video image said pseudo-random numbers are generated in said step c).

20. A digital video system comprising:
   a) processor means for processing a plurality of digital video data;
   b) digital video control counter means coupled to said processor for controlling an area of a video image; and
   c) memory means coupled to said processor means for storing an integrated collection of lookup tables comprising a plurality of static and dynamic companding lookup tables having values used to perform static and dynamic companding for transfer functions for shifting/modifying said digital video from a first plurality of data ranges to a second plurality of corresponding data ranges, said values used to perform static/dynamic companding being accessed using composite addresses, each of said composite addresses comprising a plurality of bits;
   d) partial address generation means coupled to said memory means for receiving a plurality of static/dynamic companding scheme selection control signals and controllable pseudo-random numbers as inputs, and generating a plurality of higher order bits for each of said composite addresses, the remaining lower order bits of each of said composite addresses being set correspondingly to equal said digital video data being shifted/modified by said processor means;

e) companding scheme selection control signal generation means coupled to said processor means and said partial address generation means for generating said companding scheme selection control signals; and f) pseudo-random number generation means coupled to said video control counter and said partial address generation means for receiving values of said video control counter, and generating said controllable pseudo-random numbers, said generated controllable pseudo-random numbers being replicable within said area of said video image controlled by said video control counter.

21. The digital video system as set forth in claim 20, wherein, said partial address generation means comprises a field programmable gate array coupled to said companding scheme selection control signal generation means, said pseudo-random number generation means and said memory means, for receiving said static/dynamic companding scheme selection control signals from said companding scheme selection control signal generation means, and pseudo random numbers from said pseudo-random number generation means as inputs, and generating the five higher order bits of each of said composite addresses for said memory means.

22. The digital video system as set forth in claim 20, wherein, said companding scheme selection control signal generation means comprises quantization error detection means coupled to said partial address generation means for receiving said digital video data, and conditionally generating the dynamic companding selection control signals of said plurality of static/dynamic companding scheme selection control signals for said partial address generation means, said quantization error detection means generating one of said dynamic companding scheme selection control signals whenever it detects a potential quantization error based on said received digital video data.

23. The digital video system as set forth in claim 22, wherein, said quantization error detection means generates one of said dynamic companding scheme selection control signals whenever it detects a value adjacency condition in at least a horizontal and a vertical dimension of pixel adjacency based on said received digital video data.

24. The digital video system as set forth in claim 22, wherein, said companding scheme selection control signal generation means comprises said processor means for generating the static companding scheme selection control signals of said plurality of static/dynamic companding scheme selection control signals for said partial address generation means.

25. The digital video system as set forth in claim 20, wherein, said video control counter providing values to said pseudo-random number generation means is a five-bit horizontal pixel counter providing horizontal pixel counts of a horizontal line of a video image to said pseudo-random number generation means.

* * * * *